United States Patent
Sugawara

(10) Patent No.: US 6,590,233 B2
(45) Date of Patent: Jul. 8, 2003

(54) SEMICONDUCTOR LIGHT EMITTING DEVICE

(75) Inventor: Hideto Sugawara, Tokyo (JP)

(73) Assignee: Kabushiki Kasiha Toshiba, Tokyo (JP)

( * ) Notice: Subject to any disclaimer, the term of this patent is extended or adjusted under 35 U.S.C. 154(b) by 0 days.

(21) Appl. No.: 09/942,088

(22) Filed: Aug. 28, 2001

(65) Prior Publication Data

US 2002/0117674 A1 Aug. 29, 2002

(30) Foreign Application Priority Data

Feb. 23, 2001 (JP) ........................................ 2001-048432

(51) Int. Cl.⁷ .............................................. H01L 33/00
(52) U.S. Cl. ............................................ 257/90; 357/94
(58) Field of Search ................................... 257/94, 90

(56) References Cited

U.S. PATENT DOCUMENTS

| | | | | |
|---|---|---|---|---|
| 5,506,423 A | * | 4/1996 | Saeki ........................... | 257/97 |
| 5,650,641 A | * | 7/1997 | Sassa et al. ................... | 257/88 |
| 6,144,043 A | * | 11/2000 | Ogihara et al. ............... | 257/88 |
| 6,222,203 B1 | * | 4/2001 | Ishibashi et al. .............. | 257/88 |
| 6,256,331 B1 | * | 7/2001 | Kitoh et al. ................... | 372/46 |
| 6,319,778 B1 | * | 11/2001 | Chen et al. .................. | 438/273 |
| 6,365,270 B2 | * | 4/2002 | Forrest et al. ............... | 428/336 |

FOREIGN PATENT DOCUMENTS

| | | |
|---|---|---|
| JP | 11-121806 | 4/1999 |
| JP | 2000-164931 | 6/2000 |
| WO | 98/05078 | 2/1998 |

OTHER PUBLICATIONS

"Semiconductor Light Emitting Device and Method for Manufacturing Same", Sugawara, et al.; Ser. No. 09/803,457 filed Mar. 9, 2001.

* cited by examiner

*Primary Examiner*—Carl Whitehead, Jr.
*Assistant Examiner*—William C Vesperman
(74) *Attorney, Agent, or Firm*—Hogan & Hartson, LLP

(57) ABSTRACT

The semiconductor light emitting device has the first semiconductor light emission element 13 for emitting color light in the first wave length range, the second semiconductor light emission element 14 for emitting color light in the second wave length range, the frame electrode 11 for mounting the first and second semiconductor light emission elements, and the package 19 for molding them together. The first semiconductor light emission element 13 is composed of an InGaAlP series material having an active layer 34 composed of a plurality of composite luminous layers 54, 55, 56, and 57 for emitting color light with a different wavelength. Luminescence spectra from the plurality of luminous layers are partially overlapped with each other. Each of the plurality of composite luminous layers 54, 55, 56, and 57 is further composed of a plurality of luminous layers 58 for emitting color light with substantially the same wavelength.

18 Claims, 5 Drawing Sheets

FIG. 3
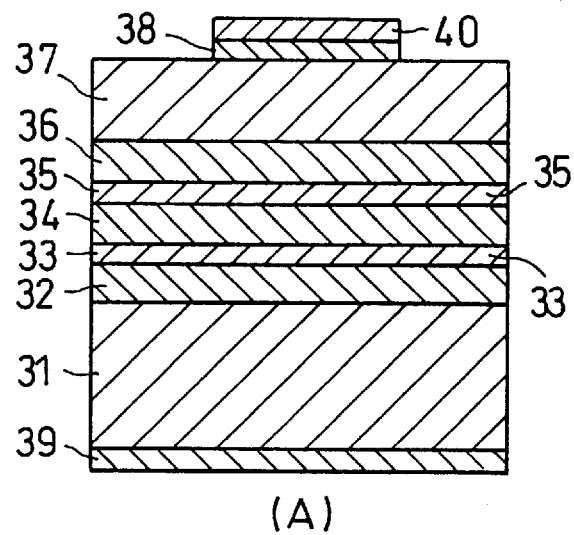
(A)
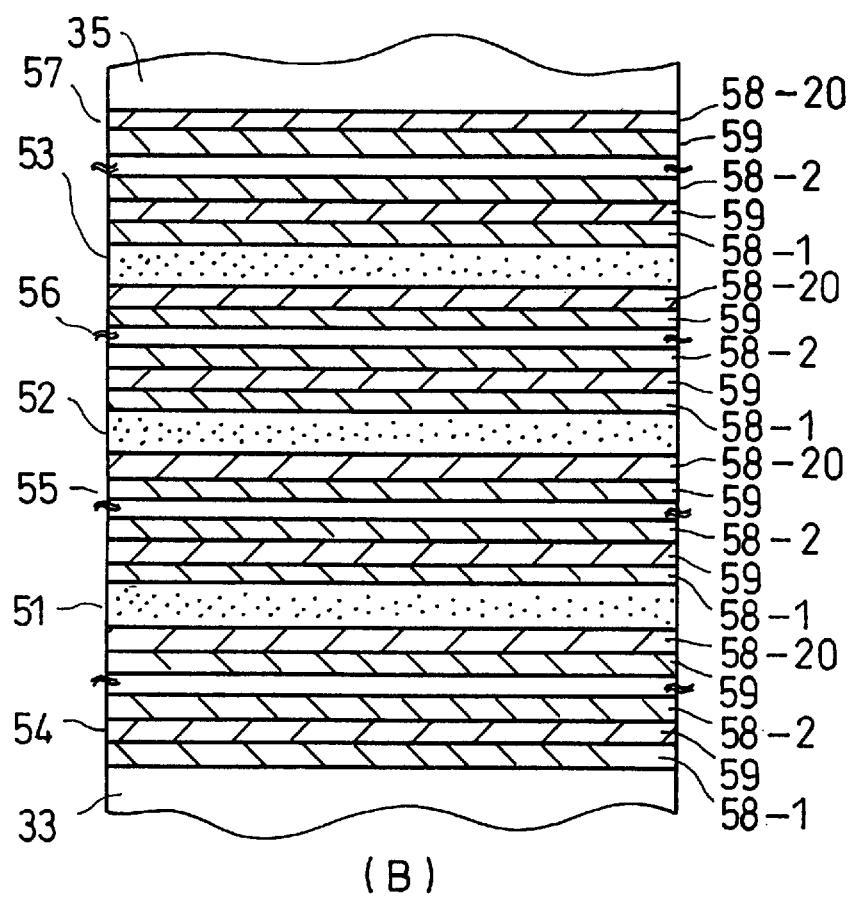
(B)

(A)   (B)

SEMICONDUCTOR LIGHT EMITTING DEVICE

CROSS REFERENCE TO RELATED APPLICATION

This application claims benefit of priority under 35 USC §119 to Japanese patent application No. 2001-048432, filed on Feb. 23, 2001, entire contents of which are incorporated by reference herein.

BACKGROUND OF THE INVENTION

The present invention relates to a semiconductor light emitting device for emitting mixed-color light and more particularly to a semiconductor light emitting device for a white light source.

A semiconductor light emitting diode (hereinafter referred to as LED) for emitting visible lights has characteristics of small size, low power consumption, and high reliability. Therefore, with high brightness of emitted lights being realized, it is used as an outdoors indicator and a communication light source and thus its use is rapidly spread. Such high-brightness LED materials as AlGaAs, GaAlP, GaP, and InGaAlP are in practical use at present, and are supplied at a low cost as element materials respectively for emitting red, orange, yellow, and green colors respectively. In addition, recently, blue and green LEDs using a GaN series material are put into practical use and thus, an LED for emitting the three primary colors of RGB (red, green, blue) at high brightness is realized. Therefore, by combination of a plurality of LEDs emitting RGB lights respectively, full-color indication is made possible.

On the other hand, another advantage of a combination of LEDs emitting RGB lights respectively is that white light can be emitted. It is expected as an illumination source. Advantages produced by replacement by the LEDs of a light electric lamp, a back light source for a liquid crystal indicator, or an automobile indicator are great from the viewpoint of reliability and cost.

Recently, a white light source has been realized by a combination of elements emitting a blue and a yellow light respectively. Specifically, a combination of a GaN series LED emitting a blue light and a yellow light phosphor, or a combination of a ZnSe series LED emitting a blue light and a yellow luminescence substrate is used. Both of the combinations include a blue light emitting LED and are characterized in that they excite and emit yellow rays.

These LEDs for a white light source are characterized in that they have a simple structure and can be miniaturized, and that they have a wide yellow luminescence spectrum band, so that their color rendering is comparatively high although light emitted by them is white light with two colors mixed.

Further, an LED is also proposed for a white light source that a plurality of luminous layers for emitting RGB respectively are formed with an InGaAlN material in an active layer of a single light emission element. This type of LED for a white light source can be more miniaturize than those described above.

However, such LEDs for a white light source as described above, has a problem that yellow rays excited and emitted by a blue luminous LED are unstable.

Further, with respect to an LED for a white light source that a plurality of luminous layers for emitting RGB respectively are formed in an active layer of a single light emission element, it is difficult to bring it into a practical use because sufficient luminous brightness of R cannot be obtained.

Therefore, an object of the present invention is to provide an LED for a white light source, which is small and has sufficient brightness and superior color rendering.

SUMMARY OF THE INVENTION

A semiconductor light-emitting device according to the present invention has a first semiconductor light emission element, e. g. a LED, for emitting color light in the first wavelength range and a second semiconductor light emission element, e. g. a LED, arranged in the neighborhood of the first semiconductor light emission element for emitting color light in the second wavelength range. The first semiconductor light emission element is made of an InGaAlP series material, and includes an active layer having a plurality of composite luminous layers for emitting color light with a different wavelength.

Luminescence spectra from the plurality of the composite luminous layers are partially overlapped with each other and each of the plurality of the composite luminous layers includes a plurality of luminous layers for emitting a color light with substantially a same wavelength.

Further, the semiconductor light emitting device according to the present invention is characterized in that it has a first semiconductor light emission element, e. g. a LED, for emitting color light in the first wave length range and a second semiconductor light emission element, e. g. a LED, arranged in the neighborhood of the first semiconductor light emission element for emitting color light in the second wave length range, and the first semiconductor light emission element is composed of an InGaAlP series material, and the light emission element composed of the InGaAlP series material has a plurality of luminous layers for emitting color light with a different wave length, and the luminescence spectra from the plurality of luminous layers are partially overlapped with each other.

In more concretely, the semiconductor light-emitting device according to the present invention is composed of two semiconductor light emission elements for emitting different kinds of color light, for example, blue and yellow light, which are complementary colors and are arranged adjacently on a same frame electrode. One of the elements for emitting the yellow light is made of an InGaAlP series material, which is arranged to have a wide-band luminescence spectrum.

Namely, the InGaAlP material has a band structure in which direct transition from red to green takes place, so that it is already widely put into practical use as a high-brightness LED material within those range of wavelength. The inventor noticed that a white light source of high brightness can be put into practical use by a combination of an InGaAlP series yellow LED and a blue LED made of GaN series material. However, on the other hand, it is found that the luminescence spectrum of the GaN series blue LED is comparatively wide, while the luminescence spectrum of the InGaAlP series LED of high brightness is narrow because the luminescence is based on the band structure of the direct transition and the color rendering of the mixed color is not sufficiently high.

FIG. 1 shows a luminescence spectrum of a white light emission element relating to the conventional embodiment. In this case, the luminescence having a peak at a wavelength of about 490 nm is from the GaN series LED and the luminescence having a peak at a wavelength of about 590 nm is luminescence from the InGaAlP series LED. The LEDs are mounted on the same frame and operated at an operation current of 20 mA. As shown in the drawing, the luminescence from the InGaAlP series LED has a narrow full width at half maximum and the color rendering is expected to be low, though white luminescence can be obtained by the mixed color.

According to the present invention, a plurality of luminous layers for emitting color light with a different wave length are formed in a light emission element made of an InGaAlP series material, thereby widening the luminescence spectrum. The color rendering of mixed-color light or white light obtained from two semiconductor light emission elements is improved.

BRIEF DESCRIPTION OF THE DRAWINGS

FIG. 3 is a cross sectional view showing a structure of a first LED shown in FIG. 2.

DETAILED DESCRIPTION OF THE INVENTION

The embodiments of the present invention will be explained hereunder with reference to the accompanying drawings.

Figure 2:
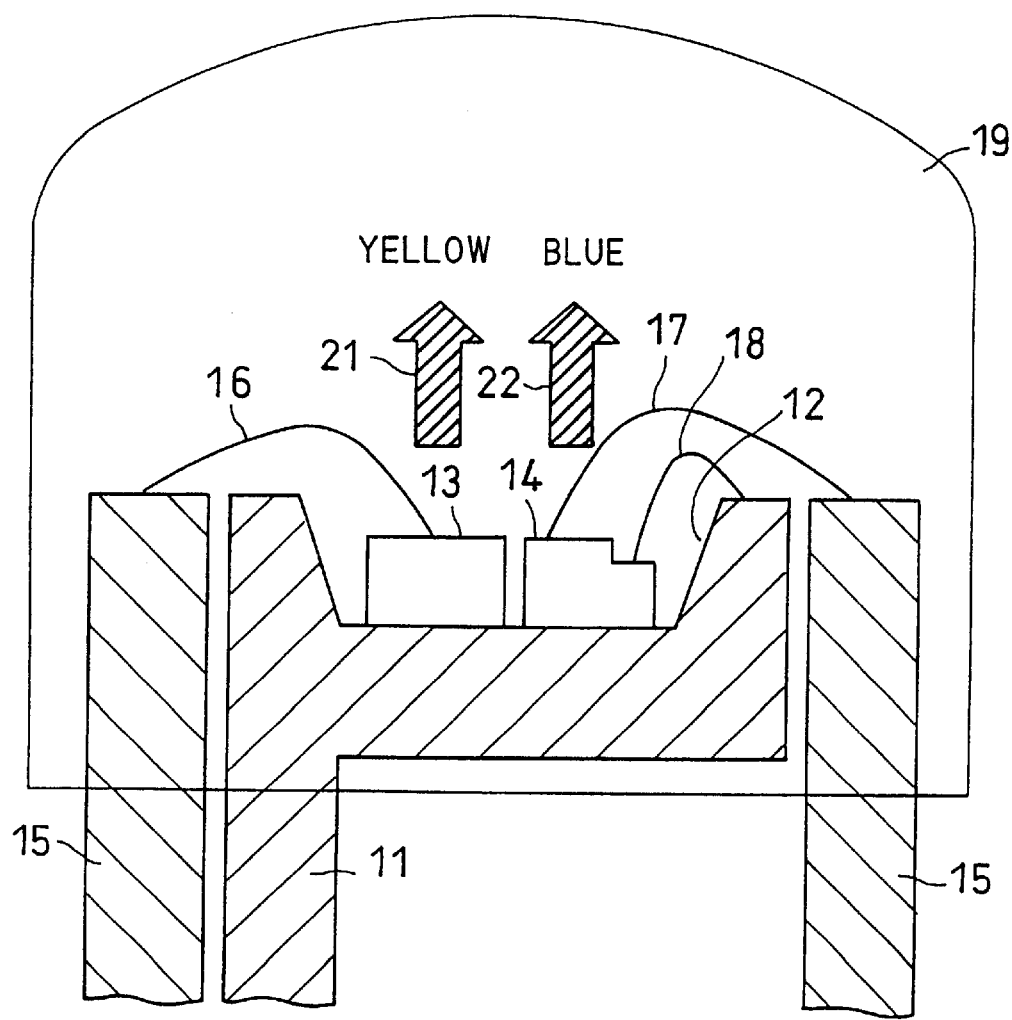
FIG. 2 is a cross sectional view showing the structure of the semiconductor light-emitting device according to the first embodiment of the present invention.

FIG. 2 is a cross sectional view showing a structure of the semiconductor light-emitting device of the first embodiment of the present invention. Inside a dish-shaped concavity 12 formed at the top end of a first frame electrode 11, a first LED 13 and a second LED 14 are arranged adjacently. The first LED 13 is a yellow LED for emitting a yellow light, which is composed, of an InGaAlP series material and in which a n-type electrode on the bottom of the element is directly connected to the top end of a first frame electrode 11. The p-type electrode on a top of the first LED 13 element is connected to a top end of a second frame electrode 15-1 by a bonding wire 16. The second frame electrode 15 is arranged in parallel with the first frame electrode 11.

On the other hand, the second LED 14 is a blue LED for emitting blue light, which is composed of a GaN series material. A p-type electrode is formed on a top of the second LED 14 element and connected to an upper end of the third frame electrode 15-2 by a bonding wire 17. An n-type electrode of the second LED 14 element is connected to an upper end of the first frame electrode 11 by a bonding wire 18. The upper ends of the first and second frame electrodes 11 and 15 are covered by a transparent dome-shaped resinous mold package 19 together with the first and second LEDs 13 and 14 mounted in the dish-shaped concavity 12 of the first frame electrode 11. The transparent dome-shaped resinous mold package 19 has a lens function for focusing yellow light and blue light emitted from the first and second LEDs 13 and 14 in the directions of arrows 21 and 22.

FIG. 3 is a cross sectional view showing a structure of the first LED 13 element shown in FIG. 2. The element, as shown in FIG. 3(A), is composed of an n-GaAs substrate 31, an n-InAlP clad layer 32, an In0.5 (Ga0.3Al0.7) 0.5P guide layer 33, an active layer 34, an In0.5 (Ga0.3Al0.7) 0.5P guide layer 35, a p-InAlP clad layer 36, a p-Ga0.2Al0.8As current spreading layer 37, and a p-GaAs contact layer 38 which are sequentially laminated. On a bottom of the layers laminated, an n-type carrier current supply electrode 39 is formed and on a top, a p-type carrier current supply electrode 40 is formed.

The composition and film thickness of each layer described above are shown below:
32: n-InAlP clad layer, 1 $\mu$m,
33: In0.5 (Ga0.3Al0.7) 0.5P guide layer, 0.05 $\mu$m,
35: In0.5 (Ga0.3Al0.7) 0.5P guide layer, 0.05 $\mu$m,
36: p-InAlP clad layer, 1 $\mu$m,
37: p-Ga0.2Al0.8As current spreading layer, 10 $\mu$m, and
38: p-GaAs contact layer, 0.01 $\mu$m.

The active layer 34 shown in FIG. 3(A), as shown in the enlarged view of FIG. 3(B), is composed of four composite luminous layers 54, 55, 56, and 57 separated by three In0.5 (Ga0.3Al0.7) 0.5P division barrier layers 51, 52, and 53. Each of the composite luminous layers 54, 55, 56, and 57 includes twenty (20) In0.5 (Ga1-xAlx) 0.5P luminous layers 58-1, 58-2, - - -, and 58-20 (only three layers are shown in each composite luminous layers 54, 55, 56, and 57 for simplicity in the drawing). The luminous layers 58 included in each of the composite luminous layers are separated from each other by In0.5 (Ga0.3A0.7) 0.5P barrier layers 59, which are thinner than the division barrier layers 51, 52, and 53.

The 20 layers of In0.5 (Ga1-xAlx) 0.5P luminous layers 58-1, 58-2, - - -, and 58-20 included in each of the composite luminous layers 54, 55, 56, and 57 have an almost same composition and emit color light with the same wave length. However, the luminous layers 58-1, 58-2, - - -, and 58-20 included in the different composite luminous layers 54, 55, 56, and 57 have a slightly different Al composition (x) from each other, and thus, each of the composite luminous layers 54, 55, 56, and 57 emits color light with a different wave length. In each of the composite luminous layers 54, 55, 56, and 57, the Al composition (x) is selected and adjusted so as to emit color light with a wave length close to each other so that the luminescence spectra emitted from the composite luminous layers are partially over lapped with each other.

Detailed structures of the luminous layers 58-1, 58-2, - - -, and 58-20 included in each of the composite luminous layers 54, 55, 56, and 57 of the active layer 34 and the barrier layers 59 are shown below:
54: 58-1/59, In0.5Ga0.5P/In0.5 (Ga0.3Al0.7) 0.5P,
55: 58-2/59, In0.5 (Ga0.8Al0.2) 0.5P/In0.5 (Ga0.3Al0.7) 0.5P,
56: 58-3/59, In0.5 (Ga0.7Al0.3) 0.5P/In0.5 (Ga0.3Al0.7) 0.5P, and
57: 58-4/59, In0.5 (Ga0.6Al0.4) 0.5P/In0.5 (Ga0.3Al0.7) 0.5P.

The structure of each of the luminous layers in each of the composite luminous layers 54, 55, 56, and 57 is a multiple quantum well structure (MQW) having twenty wells. The film thicknesses of the well and barrier layers are 5 nm and 4 nm respectively. The thickness of the division barrier layers 51, 52, and 53 for dividing each of the composite luminous layers 54, 55, 56, and 57 is selected to 20 nm thick for example.

Next, the manufacturing method therefor will be explained hereunder.

An InGaAlP compound crystal is grown using the metal organic chemical vapor deposition method (MOCVD) or the molecular beam epitaxial growth method (MBE). In the method for manufacturing the element having a structure shown in the description of the embodiment according to the present invention, the MOCVD method is used in which $AsH_3$ and $PH_3$ of V-group element compositions and trim ethyl indium (TMI), trimethyl gullium (TMG), and trimethyl aluminum (TMA) of III-group element compositions are used as growth materials. As p-type and n-type impurity materials, dimethyl zinc (DMZ) and monosilane (SiH4) are used respectively.

The growth process will be described hereunder. Firstly, a surface of a GaAs substrate 31 is cleaned with an organic solvent and a sulfuric acid series etchant. Next, the substrate is put on a heating susceptor. In this case, oxygen (air) is prevented from entering into the growth furnace via the load lock mechanism. The GaAs substrate 31 is heated up to 730° C. by supplying hydrogen carrier gas and $AsH_3$ and subjected to thermal cleaning for 10 minutes. Next, TMG, TMA, and $SiH_4$ are supplied and a n-InAlP clad layer 32 is grown. Next, stopping the supply of TMG, TMA, and $SiH_4$ once, TMI, TMG, and TMA are supplied and the InGaAlP guide layer 33 is grown. Hereafter, the supplying and stopping of the growth materials (III-group materials and impurity materials) are repeated in the same way and the growth of up to the p-GaAs contact layer 38 including the active layer 34 is carried out continuously. In this case, the film thickness of each layer is controlled by the supply amount of growth materials and growth time. The composition of each layer is determined by controlling a ratio of growth materials supplied. In this growth process, it is important to ensure the lattice matching conditions with the substrate, since crystal defects are generated and the characteristics of the element manufactured may be degraded when the conditions are not met. After growth of the p-GaAs contact layer 38, the supply of the growth material TMG and impurity material DMZ is stopped and the substrate temperature is lowered down to the room temperature at the same time. In the process for lowering the temperature, since the V-group elements in the crystals evaporate remarkably if the substrate temperature is high (up to 400° C.), V-group material ($ASH_3$ in this case) is supplied through the temperature lowering process. After the substrate temperature descent to the room temperature, the substrate is taken out from the furnace again via the load lock mechanism. The current supply electrode is patterned in a necessary shape using the photoetching process. Next, dicing or scribing separates the chip and the element shown in FIG. 2 is formed.

In the structure of the first LED 13 element thus manufactured, the active layer is divided into the four composite luminous layers 54, 55, 56, and 57 from which each luminescence is generated and is taken out of the element.

Figure 4:
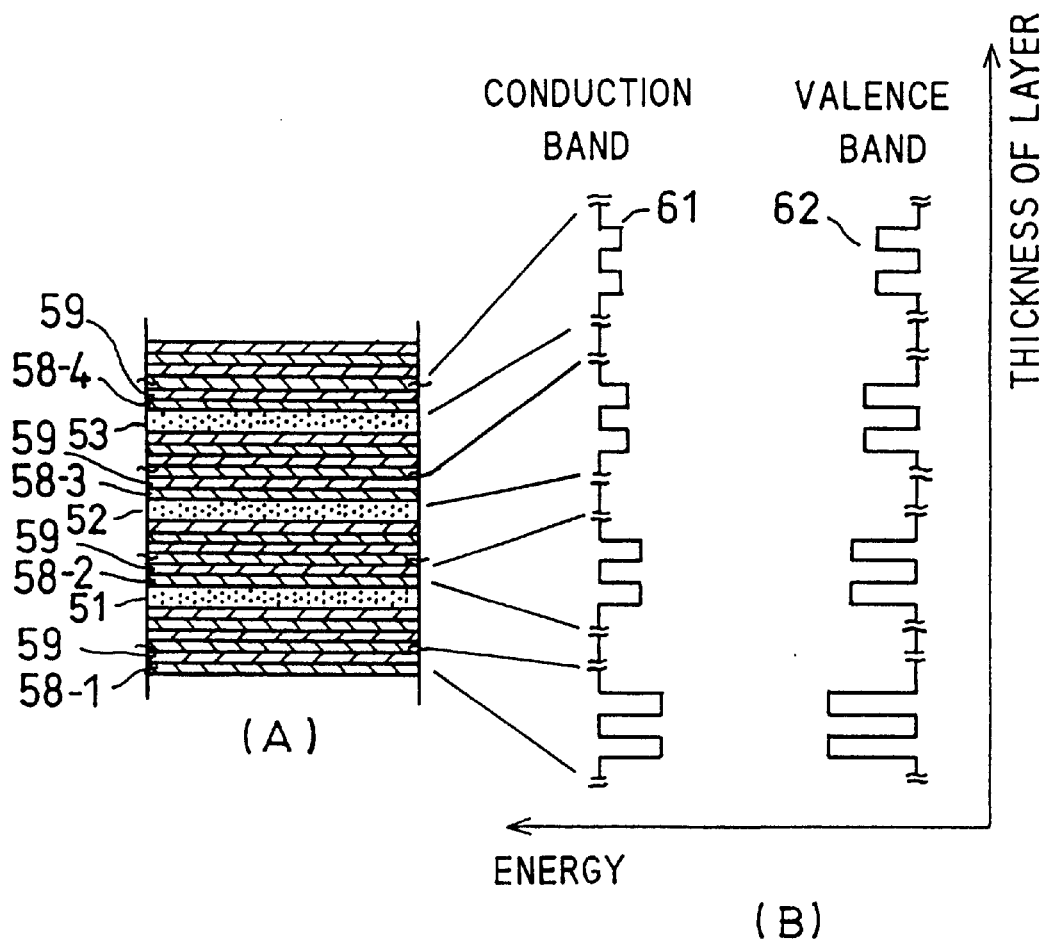
FIG. 4 is a schematic diagram showing an energy band structure of a multiple quantum well structure luminous layer constituting an active layer shown in FIG. 2.

FIG. 4 is a schematic diagram showing an energy band structure of a multiple quantum well luminous layer composed of the composite luminous layers 54, 55, 56, and 57. FIG. 4(A) is a cross sectional view of the active layer 34 composed of the composite luminous layers 54, 55, 56, and 57 and FIG. 4(B) is a diagram correspondingly showing an energy band structure of the composite luminous layers 54, 55, 56, and 57. The transverse axis of the drawing indicates energy and the ordinate axis indicates the distance of the active layer 34 in the direction of the film thickness. Curves 61 and 62 shown in the drawing respectively show the energy levels of a conduction band and a valence band.

Figure 5:
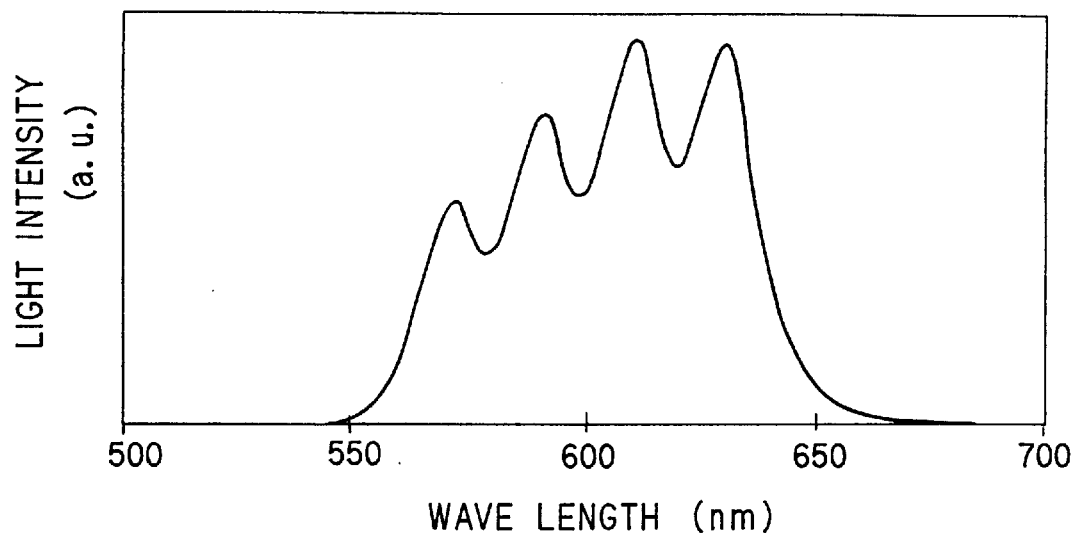
FIG. 5 is a drawing showing a luminescence spectrum of the first LED shown in FIG. 2.

FIG. 5 shows a luminescence spectrum when a bias voltage is applied to the element thus manufactured. The drawing shows that color light from each of the composite luminous layers is overlapped partially and a spectrum, as a whole, a wide band of wavelength is obtained.

Figure 1:
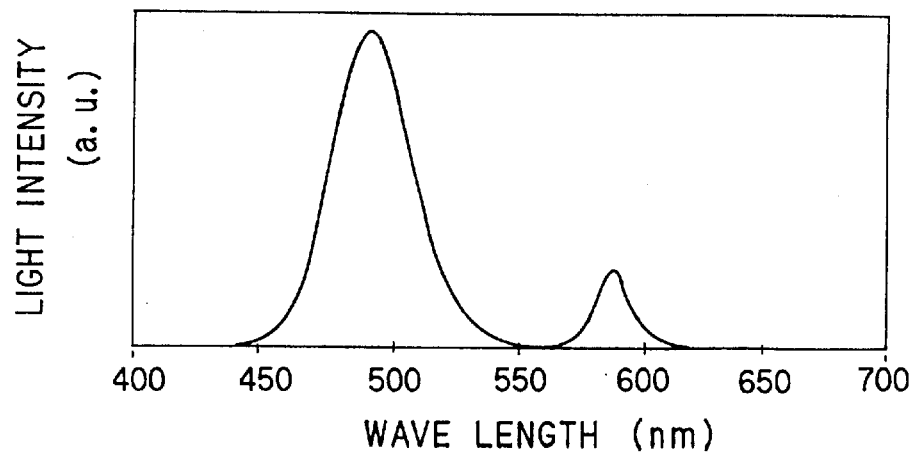
FIG. 1 is a drawing showing a luminescence spectrum obtained from a conventional semiconductor element emitting a white light.
Figure 6:
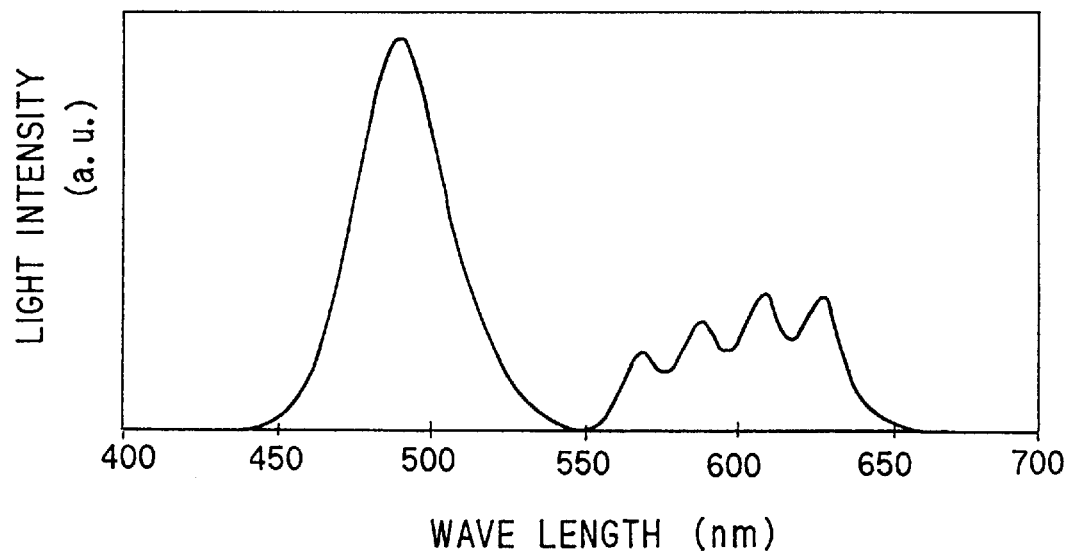
FIG. 6 is a drawing showing a luminescence spectrum of the semiconductor light-emitting device shown in FIG. 2.

FIG. 6 shows a luminescence spectrum of a semiconductor light-emitting device in which the first LED 13 and the second LED 14 of a GaN series emitting a blue light are mounted on the same frame electrode 11 designed for the white light source. Although not shown in the drawing, in the GaN series blue light emitting device, a-GaN contact clad layer, an InGaN active layer, a p-AlGaN clad layer, and a p-GaN contact layer are sequentially laminated on a sapphire substrate and current supply electrodes are formed on the n-GaN contact clad layer and p-GaN contact layer respectively. The operation currents of the first and second elements are respectively 20 mA. The comparison with the conventional example shown in FIG. 1 shows that when the element of the present invention is used, the luminous wavelength band becomes wider and a white light with high color rendering can be obtained.

Figure 7:
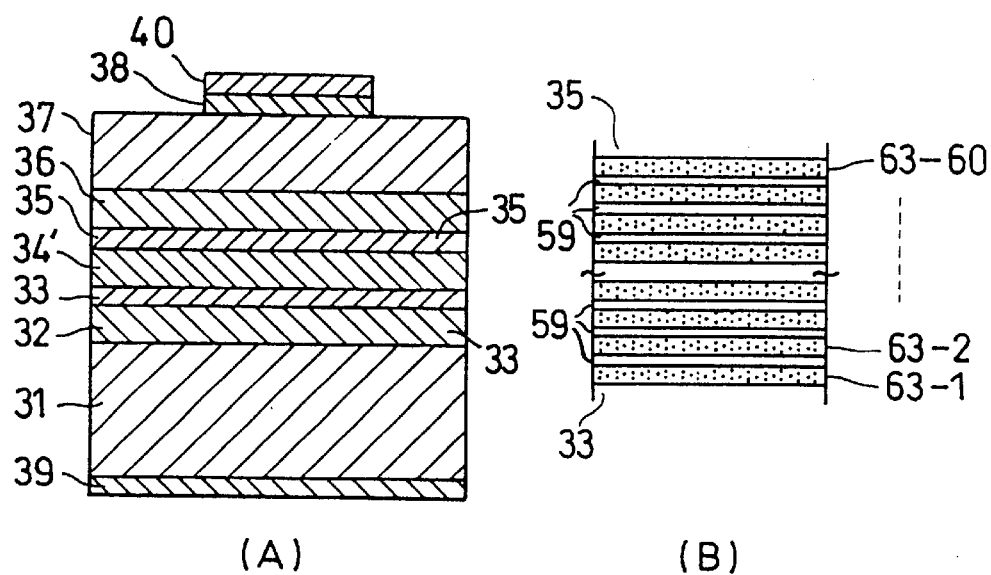
FIG. 7 is a cross sectional view of the first semiconductor light emission element for a semiconductor light emitting device according to another embodiment of the present invention.

FIG. 7 is a cross sectional view of the first semiconductor light emission element used in a semiconductor light emitting device according to another embodiment of the present invention. In the drawing, the same numeral is assigned to each of the same parts as those of the element shown in FIG. 3 and detailed explain will be omitted. A difference of the light emission element of the embodiment from that shown in FIG. 3 is in the structure of a luminous layer area 341.

In the luminous layer area 34', sixty (60) luminous layers 63-1, 63-2, 63-3, - - -, and 63-60 composed of a well layer are laminated respectively via barrier layers 59. These luminous layers 63-1, 63-2, 63-3, - - -, and 63-60 respectively include an Al composition (x) which gradually increase as their positions change from the side of the n clad layer 32 toward the side of the p clad layer 36. Namely, the compositions of the 60 luminous layers 63-1, 63-2, 63-3, - - -, and 63-60 are different from each other in such manner that the first layer 63-1 is an InGaP layer having an Al composition of 0, and the 60 th layer 63-60 is an In0.5 (Ga0.6Al0.4) 0.5P layer having an Al composition of 0.4. When the luminous area 34' is viewed as a whole, the Al composition changes gradually depending on the position of the layer. In this case, the barrier layers 59 are unified as In0.5 (Ga0.3Al0.7) 0.5P. The well luminous layers 63-1, 63-2, 63-3, - - -, and 63-60 and the barrier layers 59 have a constant film thickness of 4 nm and 5 nm respectively.

The manufacturing method of this element is almost the same as that of the first embodiment, so that the explanation thereof will be omitted.

The luminescence spectrum obtained when a bias voltage is applied to the element thus structured has a single peak wide band luminescence free of peak separation and has a full width at half maximum of about 80 nm. When the element described above is used as a first LED in the semiconductor light-emitting device for a white light source shown in FIG. 2, high color rendering characteristics is obtained as with the case with the first embodiment as compared with the conventional example.

The embodiment of the present invention is not limited to the embodiment described. For example, although GaAs is used for the substrate of an InGaAlP series LED, the light taking-out efficiency can be particularly improved, when a transparent GaP substrate is used for luminescence. For this purpose, the GaP substrate and InGaAlP layer can be integrated by adhesion instead of crystal growth.

Furthermore, from the viewpoint of light taking-out, introduction of a current prevention layer for preventing the supply current from flowing in the invalid area and introduction of a reflection layer for reflecting radiation light from the back are also effective.

Further, although the luminous layer of the embodiment is undoped, doping of impurities is effective because the luminous intensity is increased and the luminescence spectrum via the impurity level is expanded. Furthermore, the film thickness of the well layers constituting the luminous layers and the barrier layers may be changed in correspondence with the composition and is not limited to that of the embodiment described. In addition, within a scope of the present invention, the present invention may be modified variously.

According to the present invention explained above, since the InGaAlP series light emission element has a plurality of luminous layers and the luminescence spectra generated from the layers are partially overlapped with each other, an element having a wide luminous wave length band can be prepared. By combination of the element with a blue light emission element, a white light source having high color rendering can be realized.

What is claimed is:

1. A semiconductor light emitting device comprising:
    a first semiconductor light emission element for emitting color light;
    a second semiconductor light emission element;
    said first semiconductor light emission element being composed of an InGAlP series material;
    said first semiconductor light emission element having an active layer which is composed of a plurality of composite luminous layers each of which emits a color light with a different wave length from each other;
    said plurality of luminous layers having luminescence spectra partially overlapped with each other; and
    each of said plurality of composite luminous layers further composed of a plurality of luminous layers each of which emits a color light with substantially the same wave length;
    wherein said plurality of composite luminous layers are mutually divided and have a multiple quantum well structure;
    said plurality of luminous layers are composed of InGaAlP series materials having substantially the same Al composition ratio and, said luminous layers are composed of InGaAlP series materials having a different Al composition ratio from each other.

2. A semiconductor light emitting device according to claim 1, wherein said respective composite luminous layers are mutually divided by division barrier layers thicker than barrier layers of said multiple quantum structure.

3. A semiconductor light emitting device according to claim 1, wherein said first semiconductor light emission element is a first LED for emitting a yellow light and said second semiconductor light emission element is a second LED for emitting a blue light.

4. A semiconductor light emitting device according to claim 3, wherein said second LED is composed of a GaN series material.

5. A semiconductor light emitting device according to claim 3, wherein said first and said second LED are mounted on a frame electrode and are molded together.

6. A semiconductor light emitting device according to claim 5, wherein said frame electrode includes a first frame electrode on which said first and said second LED are mounted adjacently and to which one of said electrodes of each of said LEDs is commonly connected, and said frame electrode includes a second and a third frame electrode to which another electrode of said first and said second LED are connected.

7. A semiconductor light emitting device according to claim 6, wherein said second and third frame electrodes are arranged in parallel with said first frame electrodes.

8. A semiconductor light emitting device according to claim 3, wherein said first LED has a n-InGaAlP clad layer formed on a n-type semiconductor substrate, an In(GaAl)P guide layer formed on said clad layer, an active layer composed of said plurality of composite luminous layers formed on said guide layer, an In(GaAl)P guide layer formed on said active layer, a p-InAlP clad layer formed on said guide layer, a p-GaAlAs current spreading layer formed on said clad layer, a p-GaAs contact layer formed on said current spreading layer, a n-type carrier current supply electrode formed on a bottom of a laminate thus formed, and a p-type carrier current supply electrode formed on a top of said laminate.

9. A semiconductor light emitting device according to claim 8, wherein said first and second LED are mounted in a concavity formed on an upper and of said first frame electrode.

10. A semiconductor light emitting device comprising
    a first semiconductor light emission element for emitting color light;
    a second semiconductor light emission element for emitting color light;
    said first semiconductor light emission element being composed of an InGaAlP series material, and having a plurality of luminous layers for emitting color light with a different wave length; and
    said plurality of luminous layer having luminescence spectra partially overlapped with each other,
    wherein said plurality of composite luminous layers are mutually divided and have a multiple quantum well structure in which luminous layers of a quantum well layers and barrier layers are alternately laminated and, said perspective luminous layers are composed of InGalP series materials having a difference in an Al composition ratio from each other.

11. A semiconductor light emitting device according to claim 10, wherein said first semiconductor light emission element is a first LED for emitting a yellow light and said second semiconductor light emission element is a second LED for emitting a blue light.

12. A semiconductor light emitting device according to claim 11, wherein said second LED is composed of a GaN series material.

13. A semiconductor light emitting device according to claim 11, wherein said first LED has a n-InAlP clad layer formed on an n-type semiconductor substrate, an In(GaAl)P guide layer formed on said clad layer, an active layer composed of said plurality of composite luminous layers formed on said guide layer, an In(GaAl)P guide layer formed on said active layer, a p-InAlP clad layer formed on said guide layer, a p-GaAlAs current spreading layer formed on said clad layer, a p-GaAs contact layer formed on said current spreading layer, a n-type carrier current supply electrode formed on a bottom of a laminate thus formed, and a p-type carrier current supply electrode formed on a top of said laminate.

14. A semiconductor light emitting device according to claim 13, wherein said composition ratio of Al included in each of said luminous layers increases sequentially from a side of said n-clad layer to a side of said p-clad layer.

15. A semiconductor light emitting device according to claim 11, wherein said first and said second LED are mounted on a frame electrode and are molded together.

16. A semiconductor light emitting device according to claim 15, wherein said frame electrode includes a first frame electrode on which said first and said second LED are mounted adjacently and to which one of said electrodes of each of said LEDs is commonly connected, and said frame electrode includes a second and a third frame electrode to which another electrode of said first and said second LED are connected.

17. A semiconductor light emitting device according to claim 15, wherein said second and third frame electrodes are arranged in parallel with said first frame electrodes.

18. A semiconductor light emitting device according to claim 15, wherein said first and second LED are mounted in a concavity formed on an upper and of said first frame electrode.

* * * * *